(12) United States Patent
Nakazawa et al.

(10) Patent No.: US 7,414,494 B2
(45) Date of Patent: Aug. 19, 2008

(54) SURFACE ACOUSTIC WAVE APPARATUS

(75) Inventors: Michiyuki Nakazawa, Tokyo (JP);
Seisuke Mochizuka, Tokyo (JP)

(73) Assignee: TDK Corporation, Tokyo (JP)

( * ) Notice: Subject to any disclaimer, the term of this patent is extended or adjusted under 35 U.S.C. 154(b) by 307 days.

(21) Appl. No.: 11/258,279

(22) Filed: Oct. 26, 2005

(65) Prior Publication Data
US 2006/0091976 A1    May 4, 2006

(30) Foreign Application Priority Data
Oct. 28, 2004    (JP) .............................. 2004-314344

(51) Int. Cl.
*H03H 9/64*    (2006.01)
*H03H 9/72*    (2006.01)
(52) U.S. Cl. .................... 333/133; 333/193; 333/195
(58) Field of Classification Search ................. 333/193, 333/195, 133
See application file for complete search history.

(56) References Cited

U.S. PATENT DOCUMENTS

| 5,486,800 | A  | * | 1/1996  | Davenport .................. 333/193 |
| 5,682,126 | A  | * | 10/1997 | Plesski et al. ............... 333/193 |
| 6,943,645 | B2 | * | 9/2005  | Taniguchi .................. 333/133 |
| 6,975,180 | B2 | * | 12/2005 | Nakamura et al. ........... 333/133 |
| 6,995,631 | B2 | * | 2/2006  | Taniguchi .................. 333/133 |
| 7,034,638 | B2 | * | 4/2006  | Yamamoto et al. .......... 333/193 |
| 2003/0174029 | A1 | * | 9/2003 | Baier et al. ................. 333/193 |
| 2005/0206272 | A1 | * | 9/2005 | Inoue et al. ............. 310/313 B |
| 2006/0164183 | A1 | * | 7/2006 | Tikka et al. ................. 333/133 |

FOREIGN PATENT DOCUMENTS

| DE | 102 46 791 A1 | * | 4/2004 | |
| JP | 3-201613 | * | 9/1991 | .................. 333/193 |
| JP | 8-242140 | | 9/1996 | |
| JP | 9-505974 | | 6/1997 | |
| JP | 2003-332885 | | 11/2003 | |
| JP | 2004-112238 | | 4/2004 | |

* cited by examiner

*Primary Examiner*—Barbara Summons
(74) *Attorney, Agent, or Firm*—Oblon, Spivak, McClelland, Maier & Neustadt, P.C.

(57) ABSTRACT

A surface acoustic wave apparatus includes an input terminal, an output terminal, a plurality of acoustically coupled interdigital transducers (IDT), and a phase rotating element (line or inductor) connected in parallel with one or more IDT's. The acoustically coupled IDT's are connected in series between the input and output terminals. Alternatively, the acoustically coupled IDT's may include a series IDT to which the phase rotating element is connected and which is connected in series between the input and output terminals, and a branch IDT acoustically coupled to the series IDT, and disposed on a transmission path which branches from a transmission path between the input and output terminals to a reference potential. Among the plurality of IDT's, $\lambda a \geqq \lambda b$ is established, where $\lambda a$ represents an electrode finger pitch of the IDT to which the phase rotating element is connected, and $\lambda b$ represents an electrode finger pitch of the IDT to which no phase rotating element is connected.

24 Claims, 9 Drawing Sheets

FIG. 3

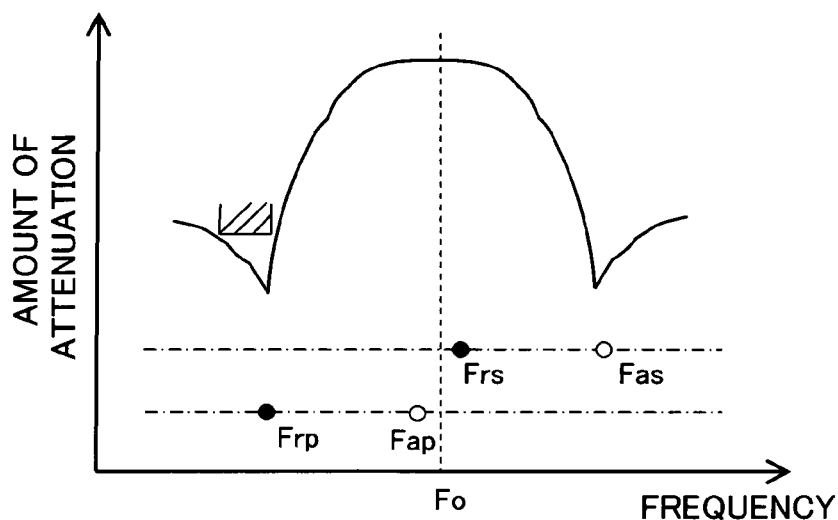

Frs: RESONANCE FREQUENCY OF SERIES RESONATOR
Fas: ANTIRESONANCE FREQUENCY OF SERIES RESONATOR
Frp: RESONANCE FREQUENCY OF BRANCH RESONATOR
Fap: ANTIRESONANCE FREQUENCY OF BRANCH RESONATOR
Fo: CENTER FREQUENCY

FIG. 4

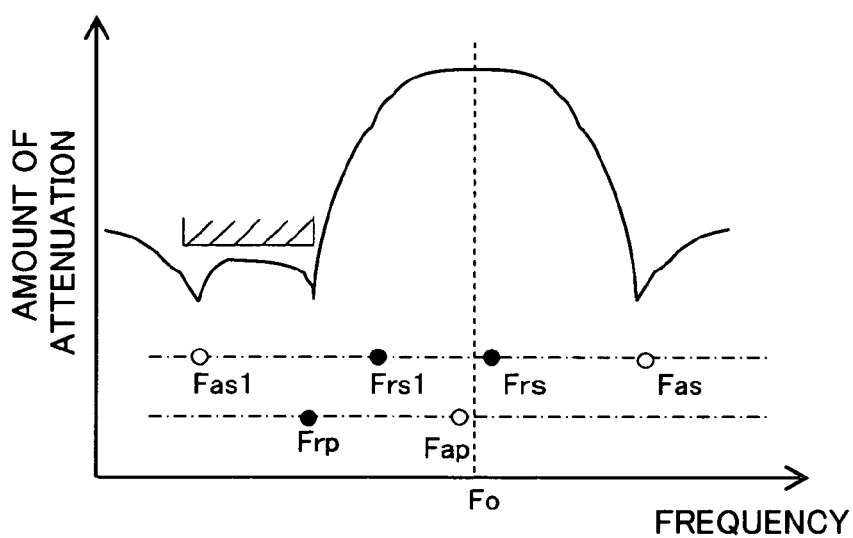

Frs1: RESONANCE FREQUENCY OF IDT TO WHICH PHASE
ROTATING ELEMENT IS CONNECTED IN PARALLEL
Fas1: ANTIRESONANCE FREQUENCY OF IDT TO WHICH PHASE
ROTATING ELEMENT IS CONNECTED IN PARALLEL

US 7,414,494 B2

SURFACE ACOUSTIC WAVE APPARATUS

BACKGROUND OF THE INVENTION

The present invention relates to a surface acoustic wave apparatus, and more particularly, to an acoustic-coupling surface acoustic wave apparatus which includes a resonator composed of a plurality of acoustically coupled interdigital transducers.

Surface acoustic wave apparatuses which utilize a surface acoustic wave (SAW) generated by the piezo-electric effect have been recently used in wide applications, including a transceiver filter, an antenna duplexer and the like for portable telephones because of their advantages of small size, light weight, and high reliability.

The SAW apparatus comprises a plurality of interdigital transducers (hereinafter called "IDT") for exciting surface acoustic waves, and reflectors for confining the surface acoustic waves excited by the associated IDT's. The IDT's and reflectors are formed on a piezo-electric substrate, where the IDT's are electrically or acoustically connected to the associated reflectors.

Known IDT connecting structures include a ladder-based structure for connecting a plurality of IDT's in a ladder shape, and an acoustic coupling type structure for acoustically coupling a plurality of IDT's which are disposed within a propagation path of a surface acoustic wave. While the number of connections for the IDT's is selected as appropriate in accordance with particular characteristics intended by the SAW apparatus, the acoustic-coupling type structure is generally advantageous over the ladder-based structure in a reduction in size resulting from a smaller number of reflectors contained therein and a shorter electrode length (shorter wiring pattern length) for connecting the resonators to each other, and the ability to omit losses within the reflectors and due to the connection electrode resistance (wiring resistance) to keep an insertion loss small.

Such SAW apparatuses have also been disclosed by JP-A-8-242140 (Patent Document 1), JP-A-9-505974 (Patent Document 2), and JP-A-2004-112238 (Patent Document 3).

SUMMARY OF THE INVENTION

Assuming a bandpass filter as representative of a SAW apparatus, the bandpass filter is desired to keep an insertion loss low in a predetermined pass band, and to provide a large attenuation out of the pass band.

However, the conventional SAW filter in the acoustic coupling structure, though capable of providing a large attenuation in a frequency range immediately near a pass band, characteristically presents an abrupt reduction in the amount of attenuation as the frequency is further away from the pass band, resulting in difficulties in the formation of a wide attenuation range. On the other hand, when an attempt is made to improve the attenuation characteristic out of the pass band, the insertion loss increases in the pass band, giving rise to a degradation in the characteristics within the pass band.

To address the foregoing problems, a variety of design efforts have conventionally been made in the structure of resonators (IDT and reflector) themselves, which constitute a filter, the number of connections, the layout, and the like. However, there is still a margin for further improvements in order to accomplish a wide and large attenuation out of the pass band.

On the other hand, the aforementioned Patent Document 1 (JP-A-8-242140) describes an acoustic coupling filter having terminals, at least one of which is connected to an inductance element in series (see FIG. 15 and Paragraph 0037 of the specification in Patent Document 1). However, the filter described in Patent Document 1 is not intended to take into consideration the characteristics of the filter out of the pass band. In addition, an inductance element connected in series, as is done in Patent Document 1, will disadvantageously increase an insertion loss by the inductance element.

The aforementioned Patent Document 2 (JP-A-9-505974) also discloses a basic configuration of acoustic coupling filter, and does not show means for improving the filter characteristics out of a pass band, similar to Patent Document 1.

Further, the applicant has disclosed in the aforementioned Patent Document 3 (JP-2004-112238) that an inductance element is connected between a SAW resonator and a reference potential electrode to increase the amount of attenuation out of a pass band to provide satisfactory frequency characteristics (see Paragraph 0084 of the specification in Patent Document 3). However, the configuration described in this document fails to form the attenuation over a wide range out of the pass band.

It is therefore an object of the present invention to improve the attenuation characteristic out of the pass band, and particularly, to form a wide attenuation range out of the pass band without entailing a degradation in characteristics within the pass band.

To solve the foregoing problems and achieve the object, a SAW (surface acoustic wave) apparatus of the present invention is a surface acoustic wave apparatus including a signal input terminal, a signal output terminal, and a plurality of acoustically coupled interdigital transducers, wherein a phase rotating element is connected in parallel with at least one of the plurality of interdigital transducers.

The plurality of acoustically coupled interdigital transducers may be connected in series between the signal input terminal and the signal output terminal.

Also, the plurality of acoustically coupled interdigital transducers may include a series interdigital transducer connected in series between the signal input terminal and the signal output terminal, and to which the phase rotating element is connected, and a branch interdigital transducer acoustically coupled to the series interdigital transducer, and disposed on a transmission path which branches from a transmission path between the signal input terminal and the signal output terminal to a reference potential.

A SAW apparatus such as a SAW filter, though capable of providing a large attenuation immediately near a pass band, tends to abruptly reduce the amount of attenuation away from the pass band, as described above, thus encountering difficulties in forming a wide attenuation range in the prior art. The inventors have made a variety of investigations for accomplishing attenuation over a wide range out of the pass band, and found, as a result, that a new attenuation pole can be formed out of the pass band by connecting a phase rotating element in parallel with at least one of a plurality of acoustically coupled interdigital transducers as in the present invention, thereby forming a larger (wider) attenuation range than before out of the pass band. In this respect, a detailed description will be given in the description of embodiments made below with reference to the drawings.

A transmission line or an inductance element (coil) can be used for the phase rotating element connected to the interdigital transducer. Alternatively, a transmission line and an inductance element may be used in combination.

In the SAW apparatus, a plurality of interdigital transducers may be connected in series between the signal input terminal and the signal output terminal, wherein the phase rotating element is connected in parallel with at least one of the plurality of interdigital transducers, and λa>λb is preferably satisfied, where λa represents an electrode finger pitch of the interdigital transducer to which the phase rotating element is connected, and λb represents an electrode finger pitch of an interdigital transducer to which no phase rotating element is connected, among the plurality of interdigital transducers.

According to the configuration as described above, the resulting SAW apparatus can not only improve the attenuation characteristic out of the pass band, as described above, but reduce an insertion loss in the pass band to improve the characteristics within the pass band as well.

Further, another SAW apparatus of the present invention comprises a signal input terminal, a signal output terminal, one or more series interdigital transducer connected in series between the signal input terminal and the signal output terminal, one or more branch interdigital transducer disposed on a transmission path which branches from a transmission path between the signal input terminal and the signal output terminal to a reference potential, where at least two of the series interdigital transducers and branch interdigital transducers are acoustically coupled to each other, and a phase rotating element connected in parallel with at least one of the plurality of interdigital transducers, wherein an element value of the phase rotating element is set to satisfy Fas1<Frp where Fas1 represents an antiresonance frequency of the series interdigital transducer to which the phase rotating element is connected, and Frp represents a resonance frequency of the branch interdigital transducer.

There has been conventionally known the configuration of a SAW apparatus such as a bandpass filter, which is formed of a series interdigital transducer connected in series between signal input and output terminals, and a branch interdigital transducer disposed on a transmission path which branches from a point between the signal input/output terminals to a reference potential. Generally, in such a SAW filter, a pass band is formed by substantially matching the resonance point of the series interdigital transducer with the antiresonance point of the branch interdigital transducer, while an attenuation pole on a high band side is formed by the antiresonance point of the series interdigital transducer, and an attenuation pole on a low band side is formed by the resonance point (resonance frequency Frp) of the branch interdigital transducer.

In such a SAW filter, when a phase rotating element is connected in parallel with at least one series interdigital transducer, a new attenuation pole can be formed in an attenuation range on the low band side by the antiresonance point (antiresonance frequency Fas1) of the series interdigital transducer to which the phase rotating element is connected, thereby making it possible to increase the width of the attenuation range out of the pass band. In this event, for forming an attenuation range as flat and wide as possible, an element value of the phase rotating element is set such that the antiresonance frequency Fas1 of the series interdigital transducer is lower than the resonance frequency Frp of the branch interdigital transducer (Fas1<Frp).

Also, the SAW apparatus according to the present invention can constitute a filter, where a SAW (surface acoustic wave) filter according to the present invention includes one or more of any of the aforementioned SAW apparatuses according to the present invention.

Further, a duplexer according to the present invention is a duplexer having a common terminal connected to an antenna, and a transmission filter and a reception filter connected to the common terminal, wherein one or both of the transmission filter and the reception filter include any of the surface acoustic wave apparatuses according to the present invention.

The duplexer of the structure as described above can form a flat and larger attenuation range in a pass band of a remote (transmission or reception) filter to provide good characteristics.

According to the present invention, it is possible to ensure a flat and larger attenuation characteristic out of the pass band without degrading the characteristics in the pass band. Other features and advantages of the present invention will be made apparent from the following description of embodiments of the present invention.

BRIEF DESCRIPTION OF THE DRAWINGS

FIG. 3 is a graph conceptually representing the frequency characteristic of the filter according to the comparative example (FIG. 2), and indicating a resonance point and an antiresonance point of each of resonators which constitute the filter;

FIG. 4 is a graph conceptually representing the frequency characteristic of the filter according to the first embodiment (FIG. 1), and indicating a resonance point and an antiresonance point of each of resonators and IDT's which constitute the filter;

DESCRIPTION OF THE EMBODIMENTS

Figure 1:
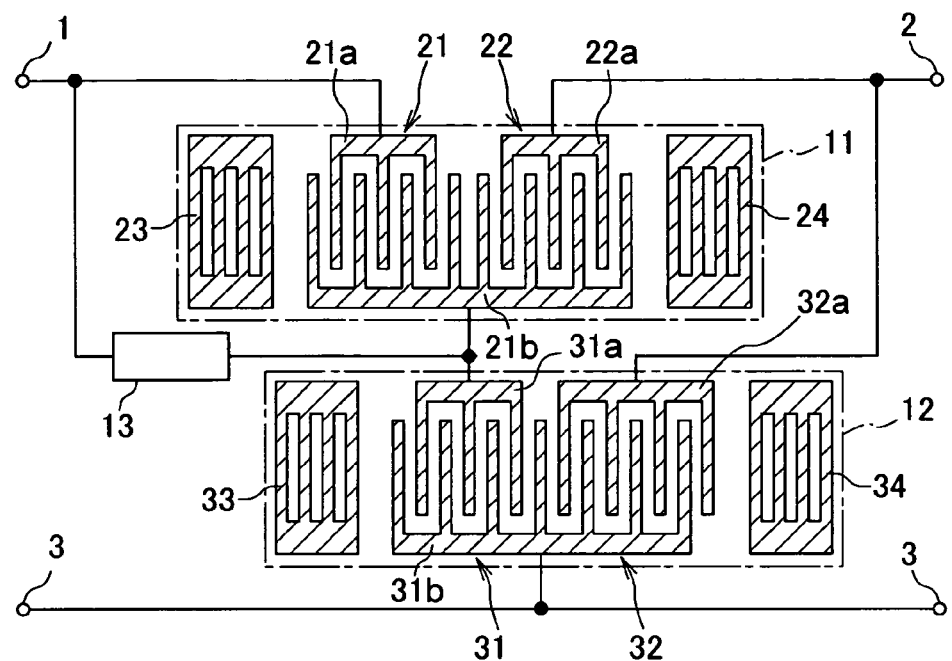
FIG. 1 is a conceptual diagram illustrating the configuration of an acoustic coupling SAW filter according to a first embodiment of the present invention.

In the following, certain embodiments of the present invention will be described with reference to the accompanying drawings. In several figures, the same reference numerals designate the same or corresponding parts.

First Embodiment

FIG. 1 is a conceptual diagram illustrating the configuration of an acoustic coupling SAW filter according to a first embodiment of the present invention. As illustrated in FIG. 1, this acoustic coupling SAW filter comprises a series resonator 11 inserted in series between a signal input terminal 1 and a signal output terminal 2; and a branch resonator 12 connected on a branch path which branches to a ground (reference potential terminal 3) from a transmission path between the signal input terminal 1 and signal output terminal 2.

The series resonator 11 comprises a pair of acoustically coupled interdigital transducers 21, 22 (hereinafter called the "IDT") formed on the substrate; and a pair of reflectors 23, 24 disposed on both sides of the IDT's 21, 22 to sandwich them. The IDT's 21, 22 and reflectors 23, 24 are formed on a piezo-electric substrate. The branch resonator 12 in turn comprises a pair of acoustically coupled IDT's 31, 32; and a pair of reflectors 33, 34 disposed on both sides of the IDT's 31, 32 to sandwich them. The IDT's 31, 32 and reflectors 33, 34 are formed on a piezo-electric substrate. Here, the piezo-electric substrate is formed of a piezo-electric single crystal such as $LiNbO_3$, $LiTaO_3$, quartz or the like, or a piezo-electric ceramic such as lead titanate zirconate based piezo-electric ceramic. Alternatively, an insulating substrate formed with a piezo-electric thin film such as a ZnO thin film may be used as the piezo-electric substrate.

The first IDT 21 (hereinafter called the "first series IDT"), which forms part of the series resonator 11, has one electrode 21a connected to the signal input terminal 1, and the other electrode 21b that is a common electrode to the second IDT 22 (hereinafter called the "second series IDT") which is acoustically coupled to the first series IDT 21 and forms part of the series resonator 11. The second series IDT 22, which forms part of the series resonator 11, has one electrode 22a connected to the signal output terminal 2, and the other electrode that is common to the electrode 21b of the first series IDT.

The first IDT 31 (hereinafter called the "first branch IDT"), which forms part of the branch resonator 12, has one electrode 31a connected to the common electrode 21b of the series resonator 11, and the other electrode 31b that is an electrode common to the second IDT 32 (hereinafter called the "second branch IDT") which is acoustically coupled to the first branch IDT 31, and forms part of the branch resonator 12. The common electrode 31b is connected to the reference potential electrode 3. Also, the second branch IDT 32, which forms part of the branch resonator 12, has one electrode 32a connected to the signal output terminal 2, and the other electrode, that is common to the electrode 31b of the first branch IDT, connected to the reference potential electrode 3.

Further, in this embodiment, a transmission line 13 is connected in parallel with the first series IDT 21 within the series resonator, as a phase rotating element. By connecting the transmission line 13 for phase rotation, a wider attenuation range is formed out of the pass band in the following manner.

Figure 2:
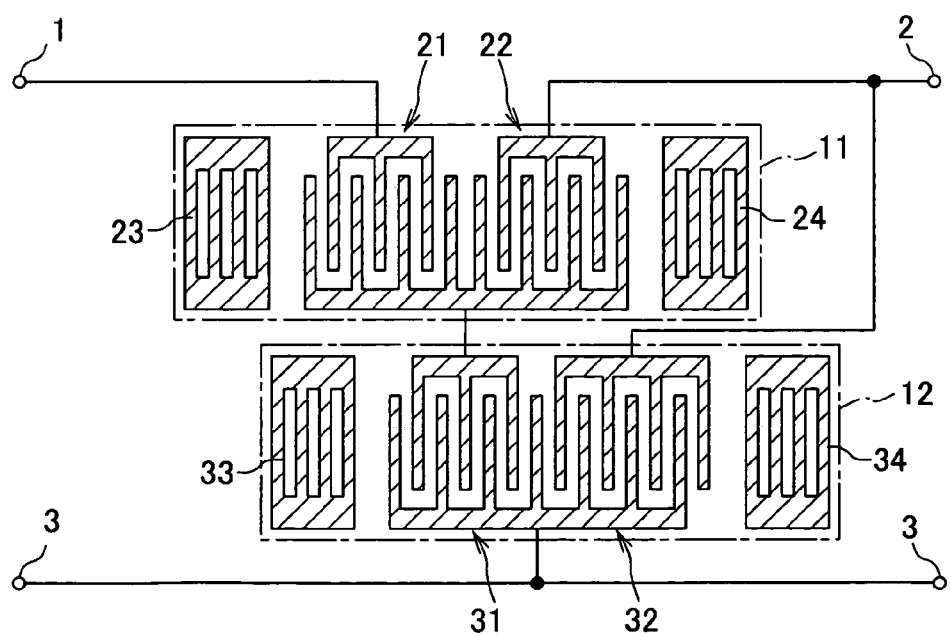
FIG. 2 is a conceptual diagram illustrating the configuration of an example for purposes of comparison with the first embodiment.

Specifically, FIG. 2 illustrates an exemplary configuration of an acoustic coupling SAW filter which is an example for purposes of comparison with the SAW filter of the first embodiment. This filter is similar to the filter of this embodiment in that it comprises a series resonator 11 and a branch resonator 12, but differs from the filter of this embodiment only in that no phase rotating element is connected to the series resonator 11.

FIGS. 3 and 4 are graphs conceptually representing the frequency-attenuation characteristics in the acoustic coupling SAW filters and indicating resonance points and antiresonance points of respective resonators which form parts of the filters, where FIG. 3 relates to the SAW filter of the comparative example illustrated in FIG. 2, and FIG. 4 relates to the SAW filter according to the first embodiment. In these graphs, Frs represents the resonance frequency of the series resonator; Fas the antiresonance frequency of the series resonator; Frp the resonance frequency of the branch resonator; Fap the antiresonance frequency of the branch resonator; Frs1 the resonance frequency of the IDT (first series IDT) to which the phase rotating element is connected in parallel; Fas1 the antiresonance frequency of the IDT (first series IDT) to which the phase rotating element is connected in parallel; and F0 the center frequency of the pass band of the filters.

As illustrated in these graphs, in the filter having the series resonator 11 and branch resonator 12, the pass band can be formed by substantially matching the resonance frequency Frs of the series resonator 11 with the antiresonance frequency Fap of the branch resonator 12. In regard to the attenuation range, an attenuation range on the high band side is formed by an attenuation pole that appears at the position of the antiresonance frequency Fas of the series resonator 11, while an attenuation range on the low band side is formed by an attenuation pole that appears at the position of the resonance frequency Frp of the branch resonator 12.

Further, in this embodiment, the phase rotating element 13 is connected in parallel with the series resonator 11 (first series IDT 21) as illustrated in FIG. 4 to produce an attenuation pole at the antiresonance point Fas1 of the first series IDT 21, thereby making it possible to form a wider attenuation range on the low band side than the comparative example (FIG. 3). The phase rotating element 13 may be connected in parallel with the second series IDT 22 (connected between a connection line between the common electrode 21b and the electrode 31a of the first branch IDT and the signal output terminal 2) or connected to both the IDT's 21, 22, with similar characteristics accomplished by either of these configurations.

Figure 5:
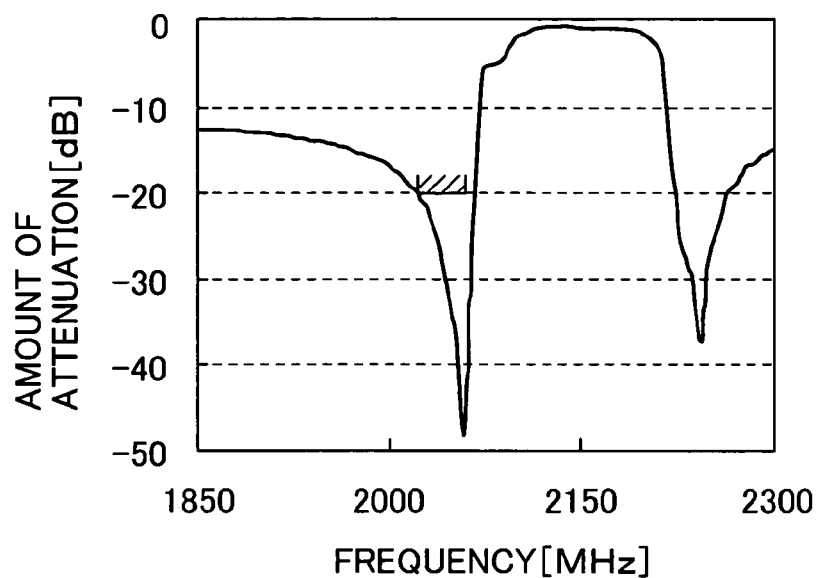
FIG. 5 is a graph representing the result of measuring the frequency characteristic of the filter according to the comparative example (FIG. 2)
Figure 6:
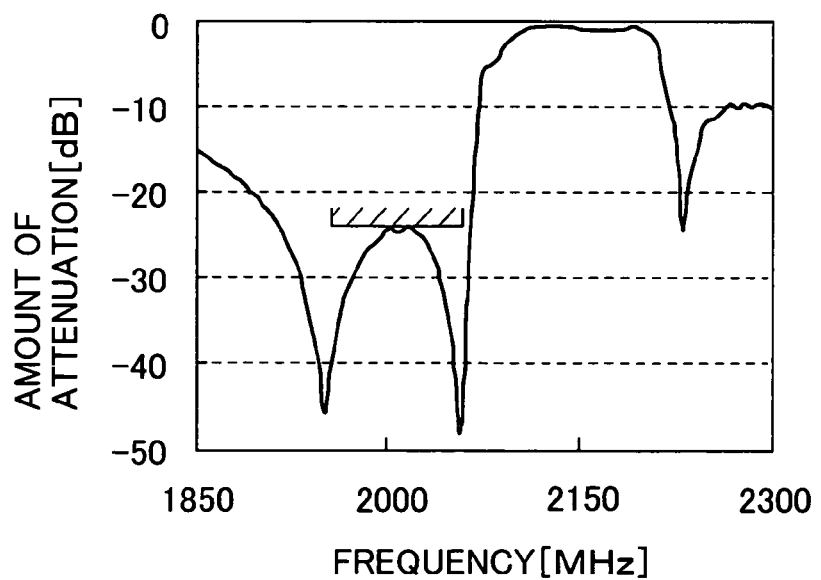
FIG. 6 is a graph representing the result of measuring the frequency characteristic of the filter according to the first embodiment.

FIG. 5 shows the result of measuring the frequency characteristic of the SAW filter of the comparative example (FIG. 2), and FIG. 6 shows the result of measuring the frequency characteristic of the SAW filter according to the first embodiment (FIG. 1). It can be seen from these graphs that the filter of this embodiment accomplishes the formation of a wider attenuation range on the low band side, as compared with the SAW filter of the comparative example.

Figure 7:
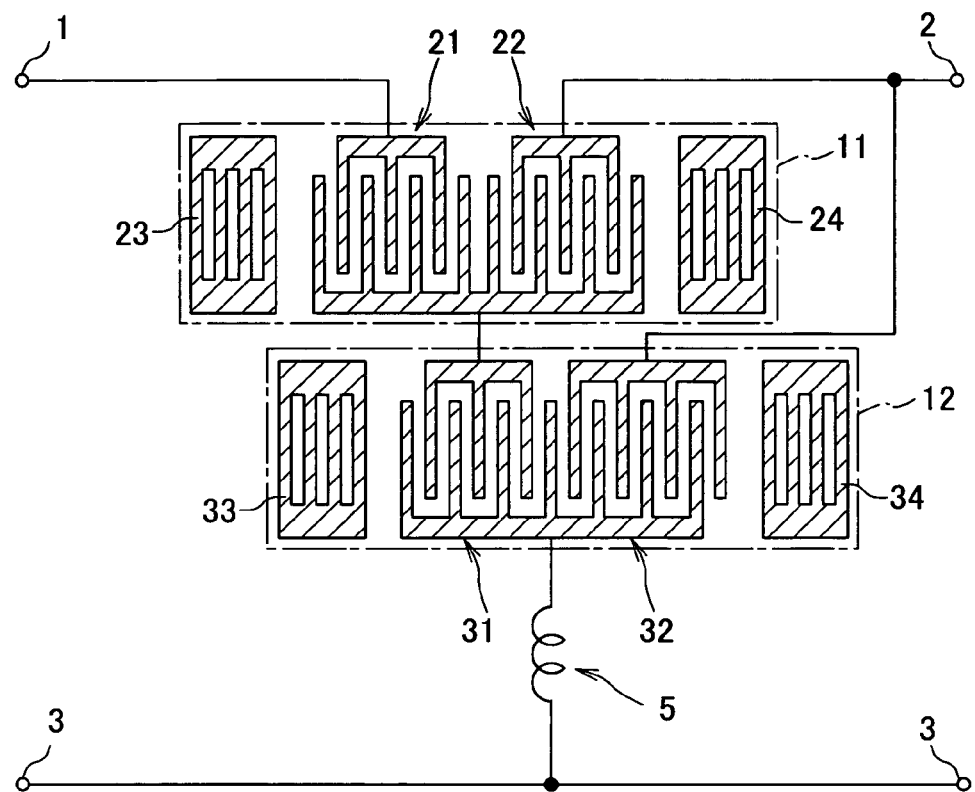
FIG. 7 is a conceptual diagram illustrating the configuration of another example for purposes of comparison with the first embodiment.
Figure 8:
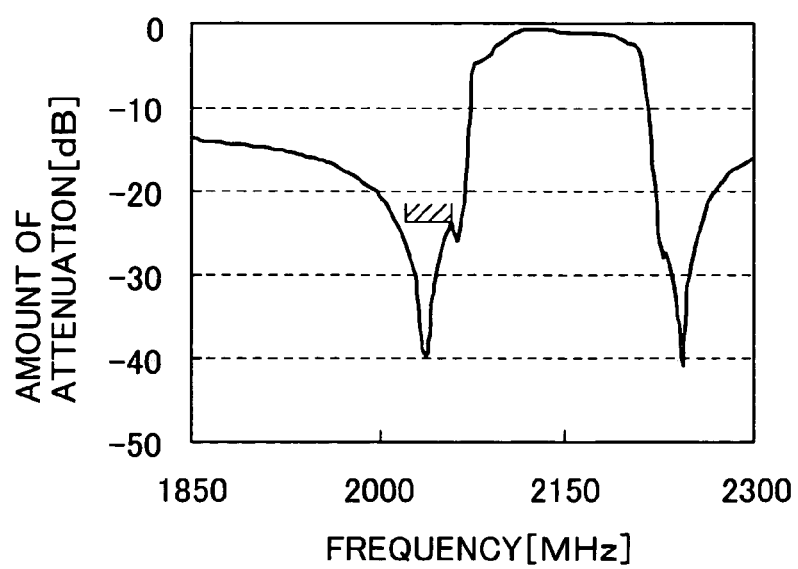
FIG. 8 is a graph representing the frequency characteristic of the filter according to the other comparative example (FIG. 7)

FIG. 7 illustrates another exemplary configuration of an acoustic coupling SAW filter for purposes of comparison with the SAW filter according to this embodiment, and FIG. 8 represents the frequency characteristic of the comparative example. The filter illustrated in FIG. 7 is similar to the filter of the first embodiment in that it comprises a series resonator 11 and a branch resonator 12, but differs from the filter of the first embodiment in that an inductance element 5 is connected in series between the branch resonator 12 and reference potential electrode 3. It can be also seen that the filter according to the first embodiment can form a wider attenuation range on the low band side, as compared with this comparative example (FIG. 8).

Further, in the SAW filter of the first embodiment, in regard to electrode finger pitches of interdigital transducers which make up the series resonator 11, an electrode finger pitch λ1 of the first series IDT 21 is preferably set to be substantially the same as or larger than an electrode finger pitch λ2 of the second series IDT 22 (λ1≧λ2). This is intended to reduce an insertion loss in the pass band to improve the filter characteristics in the pass band as well as in the attenuation range. In this respect, a detailed description will be given below.

Referring again to FIGS. 3 and 4, the pass band can be formed by substantially matching the resonance frequency Frs of the series resonator 11 with the antiresonance frequency Fap of the branch resonator 12, as previously described. Also, the resonance frequency and antiresonance frequency of the respective resonators 11, 12 can be determined to be desired values by setting the electrode finger pitches of the IDT's which make up the resonator as appropriate. Further, even when the phase rotating element 13 is connected in parallel with the IDT 21, as is done in the first embodiment, the resonance frequency Frs1 of the IDT 21, to which the phase rotating element 13 is connected, can be determined substantially by the electrode finger pitch of the IDT 21 (λ1, and the same applies to an electrode finger pitch λ6 of a first series IDT 51 described later with reference to FIG. 12).

Here, the IDT 21, to which the phase rotating element 13 is connected, presents the lowest impedance at the resonance frequency Frs1, and does not significantly affect the insertion loss of the filter. On the other hand, as the frequency is lower than the resonance frequency Frs1, the IDT 21, to which the phase rotating element 13 is connected, presents an increased impedance, and the highest impedance at the antiresonance frequency Fas1, at which an attenuation pole of the filter is formed.

In this way, in the foregoing filter structure which has the phase rotating element 13 connected in parallel with the IDT 21 that is connected in series to the input and output of the filter, the loss of the filter significantly increases as the frequency approaches to the antiresonance frequency Fas1 of the IDT 21 to which the phase rotating element 13 is connected. For this reason, when λ1<λ2 (λ6<λ5 in a filter of FIG. 12, later described), the antiresonance frequency Frs1 is positioned on the higher frequency side from the center frequency of the filter. Together with this, the antiresonance frequency Fas1 also approaches to the pass band of the filter, causing an increase in the insertion loss in the pass band of the filter and resulting in exacerbation of the filter characteristics in the pass band.

Consequently, the electrode finger pitch λ1 of the first series IDT 21 is preferably set to be substantially the same or larger than the electrode finger pitch λ2 of the second series IDT 22 (λ1≧λ2) as described above from a viewpoint of a reduction in the insertion loss in the pass band, and improvements in the filter characteristics in the pass band.

Figure 9:
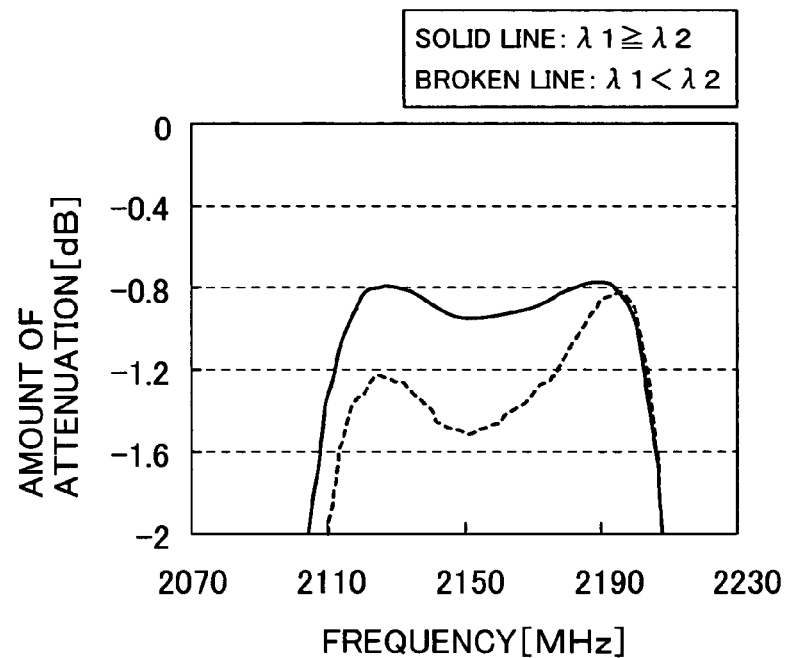
FIG. 9 is a graph representing the result of measuring the frequency characteristic when $\lambda 1 \geqq \lambda 2$ (solid line) and $\lambda 1 < \lambda 2$ (broken line) are established in the relationship between electrode finger pitches of a first series IDT and a second series IDT in the first embodiment, where $\lambda 1$ represents an electrode finger pitch of the first series IDT, and $\lambda 2$ represents an electrode finger pitch of the second series IDT.

FIG. 9 shows the results of measuring the frequency characteristic when the electrode finger pitch λ1 of the first series IDT 21 and the electrode finger pitch λ2 of the second series IDT 22 of the filter according to the first embodiment are placed in a relationship which satisfies λ1≧λ2 (solid line) and in a relationship which satisfies λ1<λ2 (broken line), where it can be seen that good characteristics can be accomplished when λ1≧λ2 is satisfied.

In regard to the branch resonator 12, an electrode finger pitch λ3 of the branch IDT's 31, 32 may be set to be larger than the electrode finger pitch λ2 of the second series IDT 22 (λ3>λ2).

Figure 10:
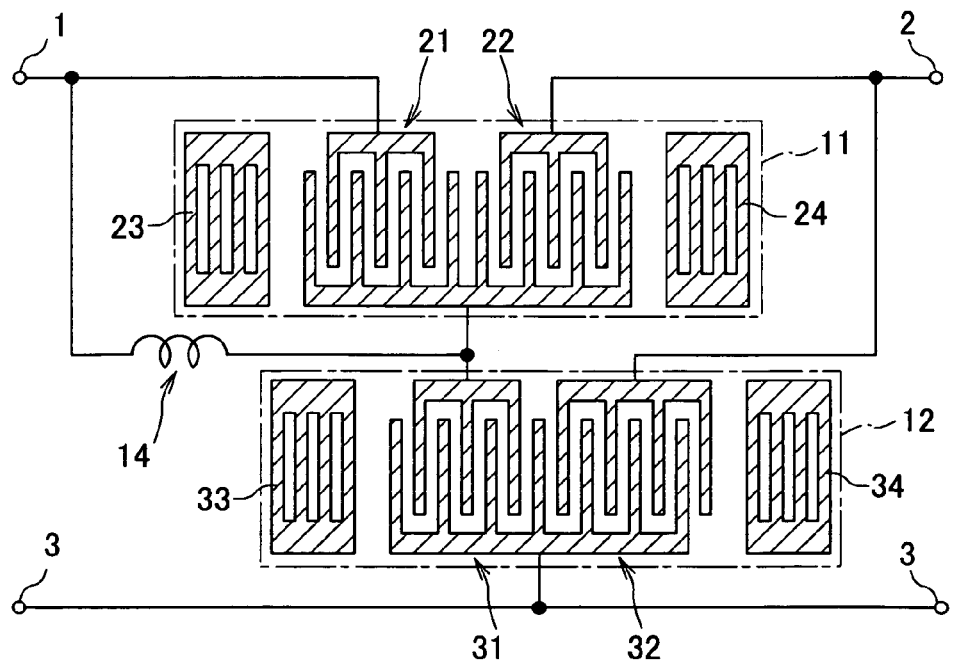
FIG. 10 is a conceptual diagram illustrating an exemplary modification to the first embodiment.
Figure 11:
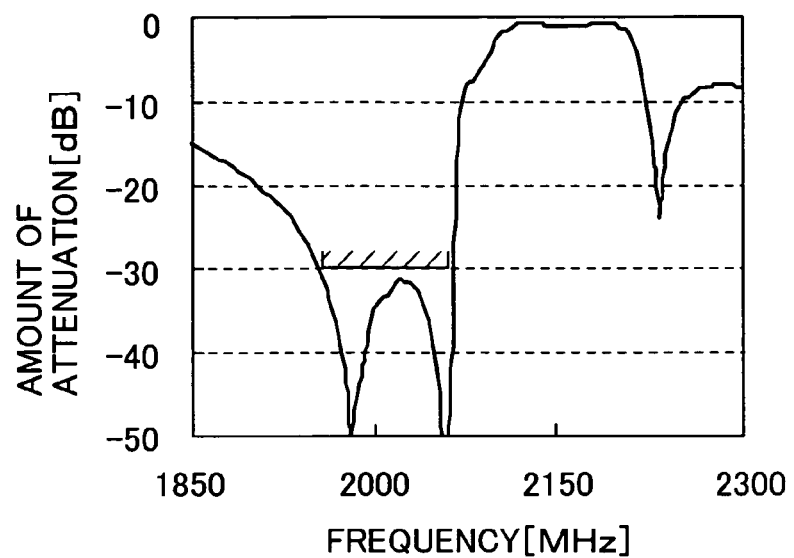
FIG. 11 is a graph representing the frequency characteristic of the filter (FIG. 10) according to the exemplary modification to the first embodiment.

The phase rotating element connected in parallel with the series resonator 11 may be an inductance element instead of the transmission line 13. FIG. 10 illustrates an exemplary configuration of this alternative filter, and FIG. 11 represents the frequency characteristic of the alternative filter. Specifically, instead of the transmission line 13 in the foregoing embodiment, an inductance element 14 is connected in parallel with the first series IDT 21 of the series resonator 11. This alternative configuration can also form a wider attenuation range on the low band side than the comparative example (FIG. 8), as is apparent from FIG. 11.

Second Embodiment

Figure 12:
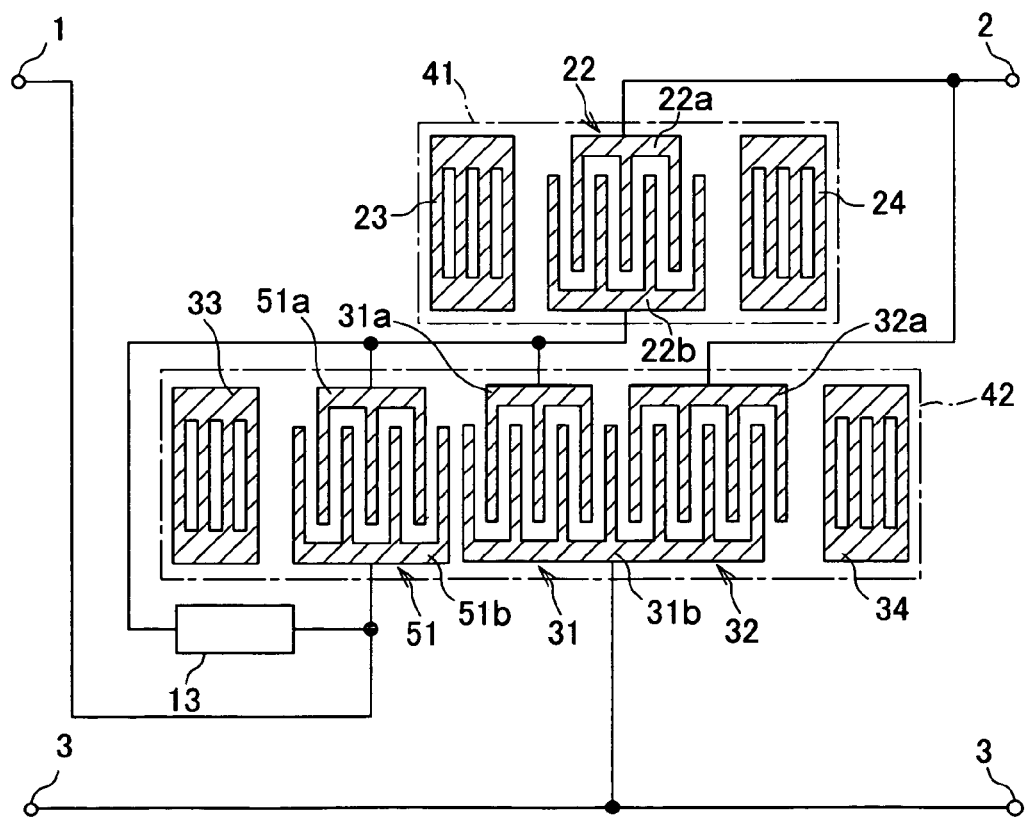
FIG. 12 is a conceptual diagram illustrating the configuration of an acoustic coupling SAW filter according to a second embodiment of the present invention.

FIG. 12 is a conceptual diagram illustrating the configuration of an acoustic coupling SAW filter according to a second embodiment of the present invention. As illustrated in FIG. 12, in this acoustic coupling SAW filter, the first series IDT 21 included in the series resonator 11, to which the phase rotating element 13 is connected, is acoustically coupled to the IDT's 31, 32 in the branch resonators connected to the reference potential electrode in the filter of the first embodiment.

Specifically, this SAW filter comprises a first resonator 41 which includes reflectors 23, 24 on both sides of an IDT 22 inserted in series to a signal input terminal 1 and a signal output terminal 2; and a second resonator 42 which includes two IDT's 31, 32 (first branch IDT 31 and second branch IDT 32) connected to a branch path that branches to the ground (reference potential terminal 3) from a transmission path between the signal input terminal 1 and signal output terminal 2, and one IDT 51 (hereinafter called the "first series IDT") inserted in series between the signal input terminal 1 and signal output terminal 2.

The respective IDT's 51, 31, 32 in the second resonator 42 are acoustically coupled to one another, and the reflectors 33, 34 are disposed on both sides of these IDT's 51, 31, 32 to sandwich them. A transmission line 13 is also connected in parallel with the first series IDT 51 in the second resonator as a phase rotating element.

The first series IDT 51 disposed in the second resonator 42 has one electrode 51a connected to the signal input terminal 1, and the other electrode 51b connected to one electrode 22b of the IDT 22 (hereinafter called the "second series IDT") in the first resonator 41. The second series IDT 22 has the other electrode 22a connected to the signal output terminal 2.

Further, the first branch IDT 31 disposed in the second resonator 42 has one electrode 31a connected to one electrode 22b of the second series IDT 22, and the other electrode 31b that is an electrode common to the second branch IDT 32 which is acoustically coupled to the first branch IDT 31. The common electrode 31b is connected to the reference potential electrode 3. Also, the second branch IDT 32 has one electrode 32a connected to the signal output terminal 2, and the other electrode that is common to the electrode 31b of the first branch IDT 31, and connected to the reference potential electrode 3.

In regard to the electrode finger pitches of the respective IDT's in the second embodiment, where the second series IDT 22 has an electrode finger pitch λ5; the first IDT 51 has an electrode finger pitch λ6; and both the first and second branch IDT's 31, 32 have an electrode finger pitch λ7, these electrode finger pitches are preferably set such that λ6 is larger than λ5 (λ6>λ5), and λ6 is substantially equal to λ7 (λ6≈λ7).

Figure 13:
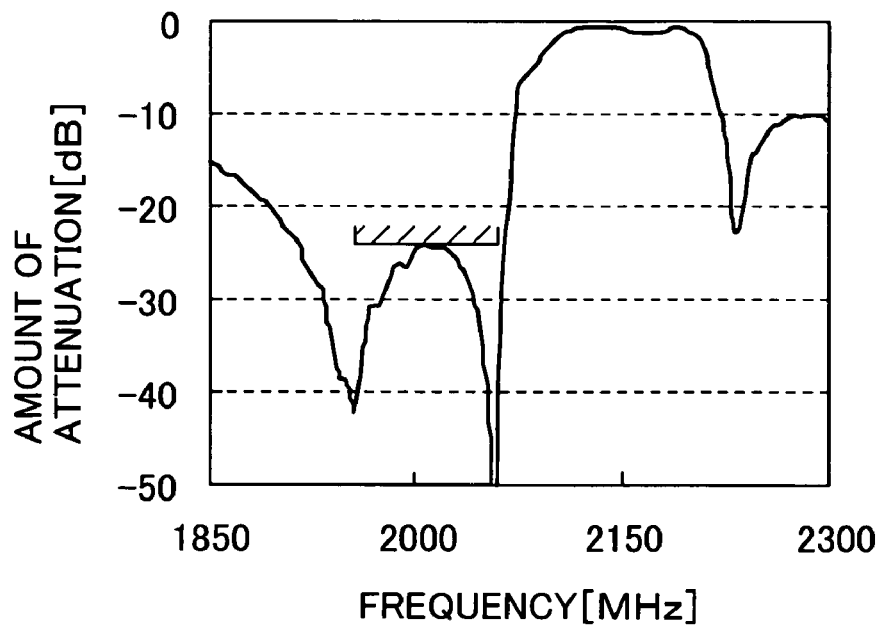
FIG. 13 is a graph representing the frequency characteristic of the filter according to the second embodiment.

FIG. 13 represents the frequency characteristic of the filter according to the second embodiment. By connecting the transmission line 13 for phase rotation in parallel with the first series IDT 51 in the second resonator, a wider attenuation range can be formed out of the pass band, in a manner similar to the first embodiment.

Figure 14:
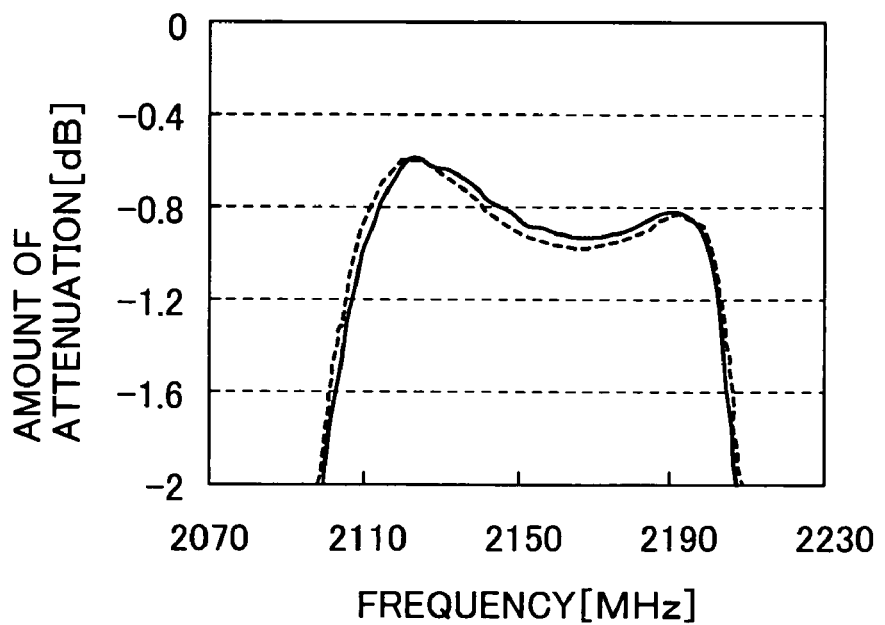
FIG. 14 is a graph representing the frequency characteristic in a pass band of the filter according to the second embodiment.

FIG. 14 represents the frequency characteristics in the pass band, where a solid line represents the frequency characteristic of the filter according to the second embodiment, and a broken line represents that of the first embodiment, where the second embodiment provides a better characteristic in the pass band than the first embodiment. This is attributable to a small loss in the second resonator 42 from the fact that the electrode finger pitch λ6 of the first series IDT 51 is substantially equal to the electrode finger pitch λ7 of the branch IDT's 31, 32 (without large variations), as described above.

While either of the second embodiment and first embodiment can improve the attenuation characteristic out of the pass band, a determination should be made as to which of the first and second embodiments is employed (to which of the series IDT and branch IDT, the series IDT 21, 51, to which the phase rotating element 13 is connected, should be acoustically coupled). For providing good characteristics in the pass band as well, the series IDT 21, 51, to which the phase rotating element is connected, is preferably acoustically coupled to an IDT which has an electrode finger pitch closer to the electrode finger pitch (λ1, λ6) of the series IDT 21, 51 to which the phase rotating element is connected in parallel.

More specifically, the configuration of the second embodiment (FIG. 12) may be employed to acoustically couple the first series IDT to the branch IDT 31, 32 when the electrode finger pitch λ1, λ6 of the series IDT 21, 51, to which the phase rotating element is connected, is closer to the electrode finger pitch λ3, λ7 of the branch IDT 31, 32 than the electrode finger pitch λ2, λ5 of the second series IDT 22. Conversely, the configuration of the first embodiment (FIG. 1) may be employed to acoustically couple the first series IDT 21, 51 to the second series IDT 2 when the electrode finger pitch λ1, λ6 of the first series IDT 21, 51 is closer to the electrode finger pitch λ2, λ5 of the second series IDT 22 than the electrode finger pitch λ3, λ7 of the branch IDT 31, 32.

Figure 15:
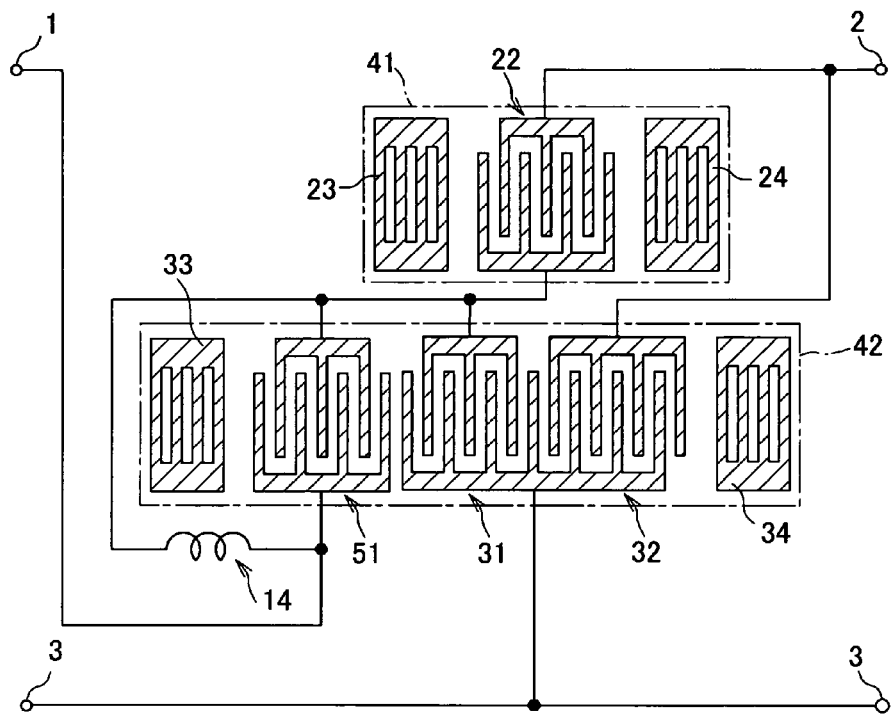
FIG. 15 is a conceptual diagram illustrating an exemplary modification to the second embodiment.

Also, in the filter of the second embodiment, the transmission path 13 may be replaced with an inductance element 14 for connection as the phase rotating element, in a manner similar to the first embodiment, as illustrated in FIG. 15.

Third Embodiment

Figure 16:
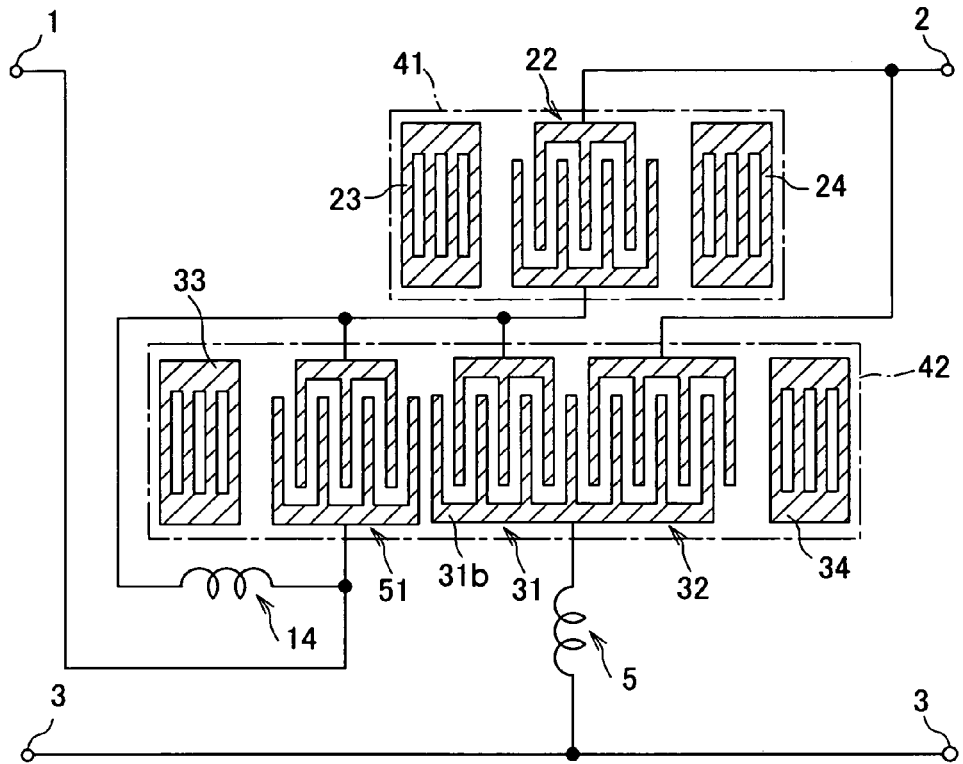
FIG. 16 is a conceptual diagram illustrating the configuration of an acoustic coupling SAW filter according to a third embodiment of the present invention.

FIG. 16 is a conceptual diagram illustrating the configuration of an acoustic coupling SAW filter according to a third embodiment of the present invention. As illustrated in FIG. 16, this acoustic coupling SAW filter additionally includes an inductance element 5 inserted in series between the common electrode 31b of the branch IDT's 31, 32 in the second resonator and the reference potential electrode 3, in the filter illustrated in FIG. 15.

Figure 17:
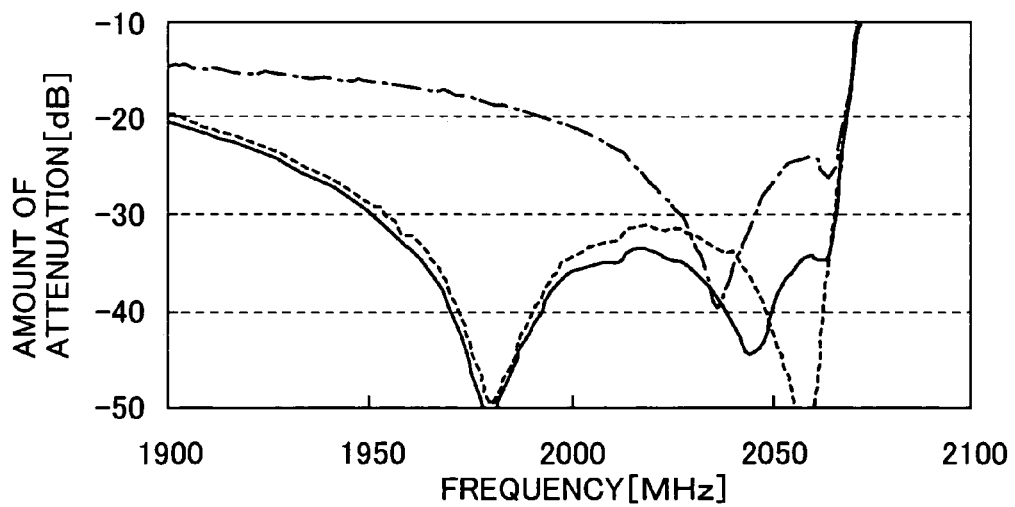
FIG. 17 is a graph representing the frequency characteristic of the filter according to the third embodiment.

FIG. 17 represents the frequency characteristic of the filter according to the third embodiment, where a solid line relates to the third embodiment (including the inductance element 14 connected in parallel with the first series IDT 51, and the inductance element 5 connected in series); a broken line relates to a filter only including the inductance element 14 connected in parallel (the configuration illustrated in FIG. 15); and a one-dot chain line relates to a filter only including the series inductance element 5.

As is apparent from FIG. 17, the filter according to the third embodiment can ensure an even larger amount of attenuation, as compared with the filter configuration which only includes the series inductance element 5, and also as compared with the filter configuration which only includes the inductance element 14 connected in parallel.

Fourth Embodiment

Figure 18:
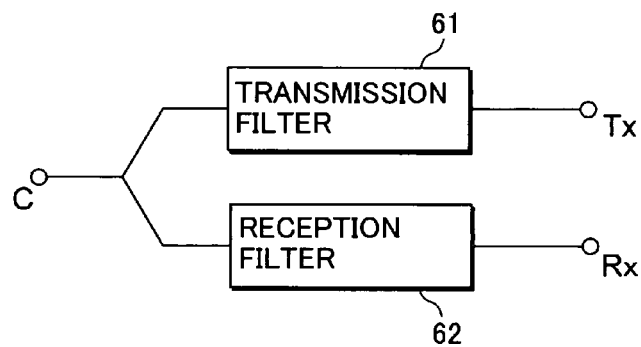
FIG. 18 is a diagram illustrating an exemplary duplexer (fourth embodiment) according to the present invention.

FIG. 18 illustrates an example of a duplexer according to the present invention. This duplexer comprises a transmission filter 61 and a reception filter 62 formed by two SAW filters which are connected to a common terminal C and have different band center frequencies from each other. One of both of the transmission filter 61 and reception filter 62 are implemented by any of the SAW filters according to the first to third embodiments including the exemplary modifications.

Each of the transmission filter 61 and reception filter 62, which make up the duplexer, is desired to keep an insertion loss low in a predetermined pass band, and provides a large attenuation out of the pass band. According to the fourth embodiment, these filters can be implemented by the SAW filter according to the present invention to achieve a duplexer which has better characteristics than before.

While several embodiments of the present invention have been described with reference to the drawings, the present invention is not so limited, but a variety of modifications can be made within the scope of the invention set forth in claims. For example, while a single phase rotating element is connected in the foregoing embodiments, some phase rotating elements may be connected in parallel with two or more IDT's, respectively. Also, the IDT's can be disposed at locations (which may be, for example, one or three or more) different from those shown in the embodiments in the series resonator and branch resonator. Further, the number of transducer fingers of the IDT's (shown in a simplified form in the figures), electrode finger pitches, and the like can be set in a variety of ways other than the aforementioned embodiments. In addition, the number of connected resonators (IDT's) may also take a variety of forms in accordance with required characteristics of a particular filter.

What is claimed is:

1. A surface acoustic wave apparatus including a signal input terminal,
    a signal output terminal, a first series interdigital transducer, a second series interdigital transducer, and a branch interdigital transducer, the first and second interdigital transducers being connected in series between the signal input terminal and the signal output terminal, and the branch interdigital transducer being disposed on a transmission path which branches from a transmission path between the signal input terminal and the signal output terminal to a reference potential, wherein:
    a phase rotating element is connected in parallel with said first series interdigital transducer,
    said first series interdigital transducer is acoustically coupled with said second series interdigital transducer,
    said first series interdigital transducer has a closer electrode finger pitch to an electrode finger pitch of said second series interdigital transducer than an electrode finger pitch of said branch interdigital transducer.

2. The surface acoustic wave apparatus according to claim 1, wherein:
    no phase rotating element is connected with said second series interdigital transducer, $\lambda a \geqq \lambda b$ is satisfied, where $\lambda a$ represents the electrode finger pitch of said first series interdigital transducer to which said phase rotating element is connected, and $\lambda b$ represents an electrode finger pitch of the second series interdigital transducer to which no phase rotating element is connected, among said first and second series interdigital transducers.

3. A surface acoustic wave filter including one or more of the surface acoustic wave apparatus according to claim 2.

4. A duplexer having a common terminal connected to an antenna, and a transmission filter and a reception filter connected to said common terminal, wherein:
one or both of said transmission filter and said reception filter include the surface acoustic wave apparatus according to claim 2.

5. The surface acoustic wave apparatus according to claim 1, wherein:
an element value of said phase rotating element is set to satisfy $Fas1 < Frp$, where $Fas1$ represents an antiresonance frequency of said first series interdigital transducer to which said phase rotating eclement is connected, and $Frp$ represents a resonance frequency of said branch interdigital transducer.

6. A surface acoustic wave filter including one or more of the surface acoustic wave apparatus according to claim 5.

7. A duplexer having a common terminal connected to an antenna, and a transmission filter and a reception filter connected to said common terminal, wherein:
one or both of said transmission filter and said reception filter include the surface acoustic wave apparatus according to claim 5.

8. The surface acoustic wave apparatus according to claim 1, wherein:
said phase rotating element includes one or both of a transmission line and an inductance element.

9. A surface acoustic wave filter including one or more of the surface acoustic wave apparatus according to claim 8.

10. A duplexer having a common terminal connected to an antenna, and a transmission filter and a reception filter connected to said common terminal, wherein:
one or both of said transmission filter and said reception filter include the surface acoustic wave apparatus according to claim 8.

11. A surface acoustic wave filter including one or more of the surface acoustic wave apparatus according to claim 1.

12. A duplexer having a common terminal connected to an antenna, and a transmission filter and a reception filter connected to said common terminal, wherein:
one or both of said transmission filter and said reception filter include the surface acoustic wave apparatus according to claim 1.

13. A surface acoustic wave apparatus including a signal input terminal, a signal output terminal, a first series interdigital transducer, a second series interdigital transducer, and a branch interdigital transducer, the first and second interdigital transducers being connected in series between the signal input terminal and the signal output terminal, and the branch interdigital transducer being disposed on a transmission path which branches from a transmission path between the signal input terminal and the signal output terminal to a reference potential, wherein:
a phase rotating element is connected in parallel with said first series interdigital transducer,
said first series interdigital transducer is acoustically coupled with said branch interdigital transducer,
said first series interdigital transducer has a closer electrode finger pitch to an electrode finger pitch of said branch interdigital transducer than an electrode finger pitch of said second series interdigital transducer.

14. The surface acoustic wave apparatus according to claim 13, wherein:
no phase rotating element is connected with said second series interdigital transducer,
$\lambda a \geqq \lambda b$ is satisfied, where $\lambda a$ represents the electrode finger pitch of said first series interdigital transducer to which said phase rotating element is connected, and $\lambda b$ represents an electrode finger pitch of the second series interdigital transducer to which no phase rotating element is connected, among said first and second series interdigital transducers.

15. A surface acoustic wave filter including one or more of the surface acoustic wave apparatus according to claim 14.

16. A duplexer having a common terminal connected to an antenna, and a transmission filter and a reception filter connected to said common terminal, wherein:
one or both of said transmission filter and said reception filter include the surface acoustic wave apparatus according to claim 14.

17. The surface acoustic wave apparatus according to claim 13, wherein:
an element value of said phase rotating element is set to satisfy $Fas1 < Frp$, where $Fas1$ represents an antiresonance frequency of said first series interdigital transducer to which said phase rotating element is connected, and $Frp$ represents a resonance frequency of said branch interdigital transducer.

18. A surface acoustic wave filter including one or more of the surface acoustic wave apparatus according to claim 17.

19. A duplexer having a common terminal connected to an antenna, and a transmission filter and a reception filter connected to said common terminal, wherein:
one or both of said transmission filter and said reception filter includes the surface acoustic wave apparatus according to claim 17.

20. The surface acoustic wave apparatus according to claim 13, wherein:
said phase rotating element includes one or both of a transmission line and an inductance element.

21. A surface acoustic wave filter including one or more of the surface acoustic wave apparatus according to claim 20.

22. A duplexer having a common terminal connected to an antenna, and a transmission filter and a reception filter connected to said common terminal, wherein:
one or both of said transmission filter and said reception filter include the surface acoustic wave apparatus according to claim 20.

23. A surface acoustic wave filter including one or more of the surface acoustic wave apparatus according to claim 13.

24. A duplexer having a common terminal connected to an antenna, and a transmission filter and a reception filter connected to said common terminal, wherein:
one or both of said transmission filter and said reception filter include the surface acoustic wave apparatus according to claim 13.

* * * * *